(12) United States Patent
Lai et al.

(10) Patent No.: US 8,627,265 B2
(45) Date of Patent: Jan. 7, 2014

(54) COMPUTING DEVICE AND METHOD FOR AUTOMATICALLY CHECKING WIRING INFORMATION

(75) Inventors: Ying-Tso Lai, New Taipei (TW); Dan-Chen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/534,046

(22) Filed: Jun. 27, 2012

(65) Prior Publication Data

US 2013/0125082 A1    May 16, 2013

(30) Foreign Application Priority Data

Nov. 15, 2011   (TW) .............................. 100141680 A

(51) Int. Cl.
*G06F 17/50* (2006.01)

(52) U.S. Cl.
USPC ........................................................ 716/137

(58) Field of Classification Search
USPC ........................................................ 716/137
See application file for complete search history.

(56) References Cited

U.S. PATENT DOCUMENTS

2005/0229129 A1* 10/2005 Tsai et al. ........................ 716/6
2008/0288908 A1* 11/2008 Hart et al. ....................... 716/15

* cited by examiner

*Primary Examiner* — Vuthe Siek
(74) *Attorney, Agent, or Firm* — Altis Law Group, Inc.

(57) ABSTRACT

In a computing device, a computerized method and a non-transitory storage medium are applied in checking a stored wiring diagram for high-noise components in close proximity to signal lines. An electronic component is selected in a PCB wiring file. A checking range of the selected electronic component is determined for searching for one or more signal transmission lines which pass within the checking range in the PCB wiring file. Basic information of the one or more signal transmission lines is recorded into a result list which is displayed on a display unit of the computing device.

9 Claims, 5 Drawing Sheets

COMPUTING DEVICE AND METHOD FOR AUTOMATICALLY CHECKING WIRING INFORMATION

BACKGROUND

1. Technical Field

Embodiments of the present disclosure relate to wiring design, and more particularly to a computing device and a method for automatically checking wiring information.

2. Description of Related Art

Printed circuit boards (PCBs) may include a component layer which is on the top of the PCB, and one or more wiring layers which are inside the PCB. Electronic components, especially high noise components, such as voltage regulators and crystal oscillators mounted on the component layer, may cause electromagnetic inference (EMI) to the signal transmission lines embedded in the wiring layers, as illustrated in FIG. 1A. The electromagnetic inference may degrade signals passing through the signal transmission lines, as illustrated in FIG. 1B.

For avoiding the electromagnetic inference, the signal transmission lines need to be kept away from the high noise components. However, existing PCB wiring software does not alert a wiring engineer of any signal transmission lines near the high noise components. Thus, the wiring engineer must check for this manually. It is time-consuming and troublesome for the wiring engineer to do the check.

DETAILED DESCRIPTION

In general, the word "module," as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1A:
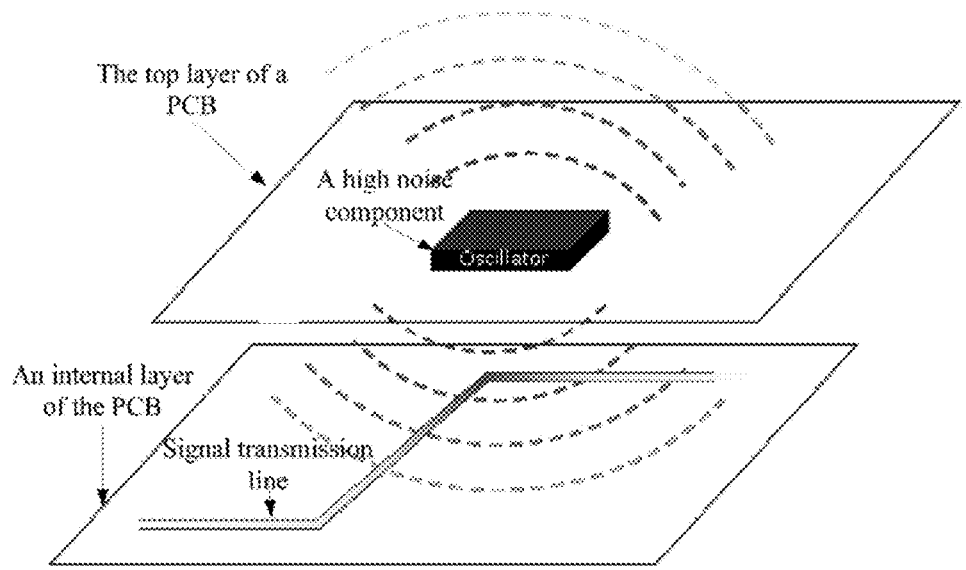
FIG. 1A illustrates electromagnetic inference generated by a high noise component.
Figure 1B:
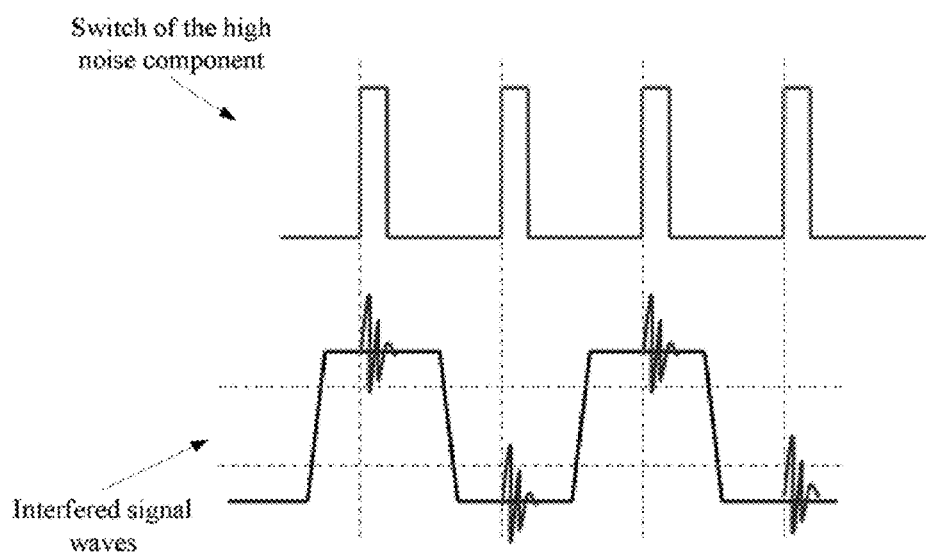
FIG. 1B illustrates signal waves interfered with by electromagnetic inference.
Figure 2:
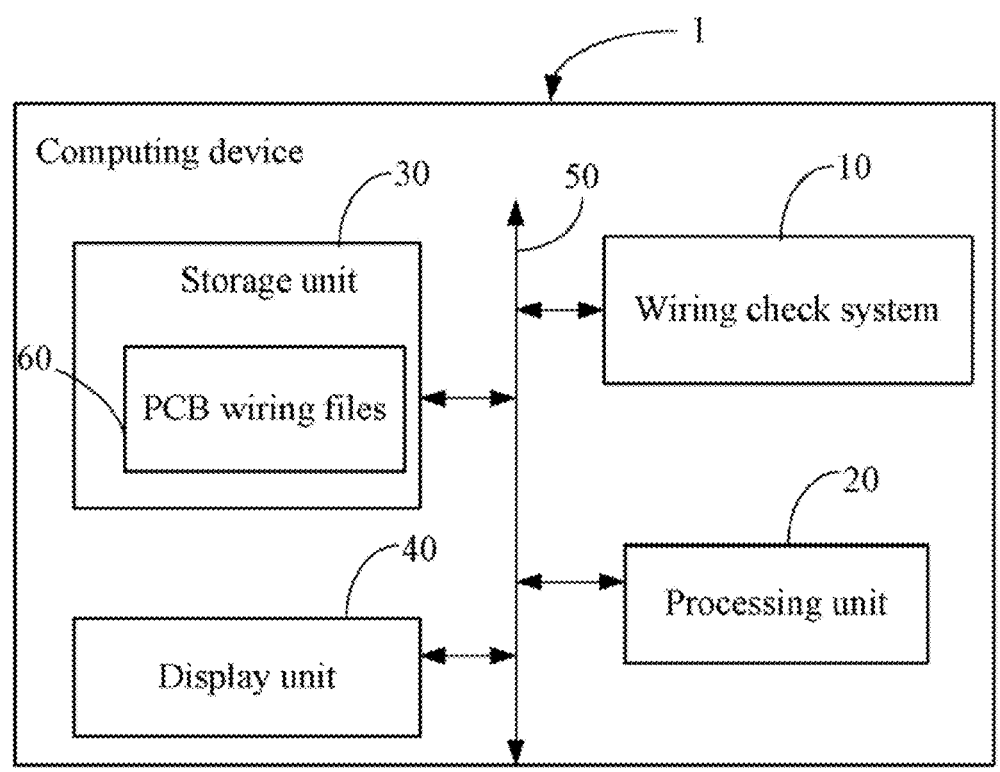
FIG. 2 is a block diagram of one embodiment of a computing device having a wiring check system.

FIG. 2 is a block diagram of one embodiment of a computing device 1 having a wiring check system 10. The computing device 1 may be a computer, a server, or a personal digital assistant (PDA), for example. The computing device 1 may further include components such as a processing unit 20, a storage unit 30, a display unit 40, and a bus 50. The computing device 1 may be configured in a number of other ways and may include other or different components.

Figure 3:
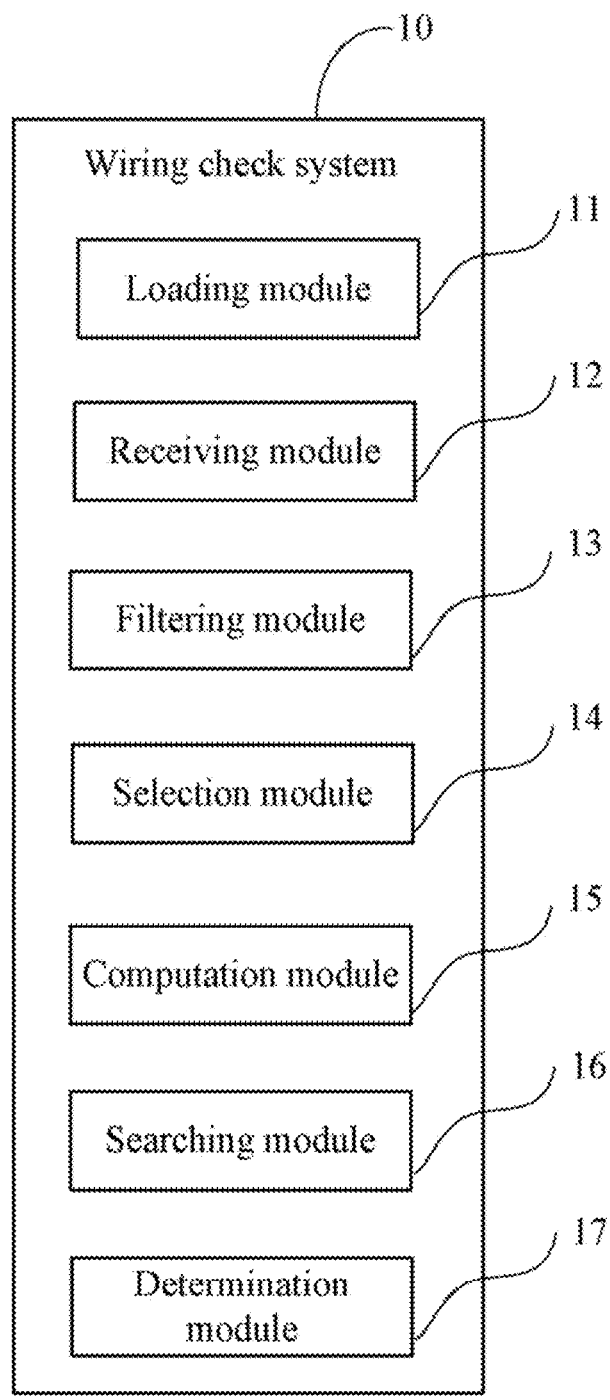
FIG. 3 is a block diagram of one embodiment of function modules of the wiring check system in FIG. 1.

The wiring check system 10 includes a number of function modules (depicted in FIG. 3). The function modules may include computerized codes in the form of one or more programs, which have functions of automatically checking whether there is any signal transmission line near an electronic component, especially a high noise component, in a wiring diagram.

The bus 50 permits communication among the components, such as the wiring check system 10, the processing unit 20, the storage unit 30, and the display unit 40.

The processing unit 20 may include a processor, a microprocessor, an application-specific integrated circuit (ASIC), or a field programmable gate array, (FPGA) for example. The processing unit 20 may execute the computerized codes of the function modules of the wiring check system 10 to realize the functions of the wiring check system 10.

The storage unit 30 may include some type(s) of computer-readable storage medium, such as a hard disk drive, a compact disc, a digital video disc, or a tape drive. The storage unit 30 stores the computerized code of the function modules of the wiring check system 10 for execution by the processing unit 20.

The storage unit 30 also stores one or more PCB wiring files 60, each of which includes a wiring diagram. A wiring diagram is an electronic file of a simplified conventional pictorial representation of an electrical circuit, in which multiple electrical components are wired together using transmission lines.

The display unit 40 may include one or more output mechanisms, including a display, or a printer, for example, for displaying the wiring diagrams and outputting the results of checking the wiring diagrams.

FIG. 3 is a block diagram of one embodiment of function modules of the wiring check system 10. In one embodiment, the wiring check system 10 may include a loading module 11, a receiving module 12, a filtering module 13, a selection module 14, a computation module 15, a searching module 16, and a determination module 17. The function modules 11 to 17 provide at least the functions needed to execute the steps illustrated in FIG. 4.

Figure 4:
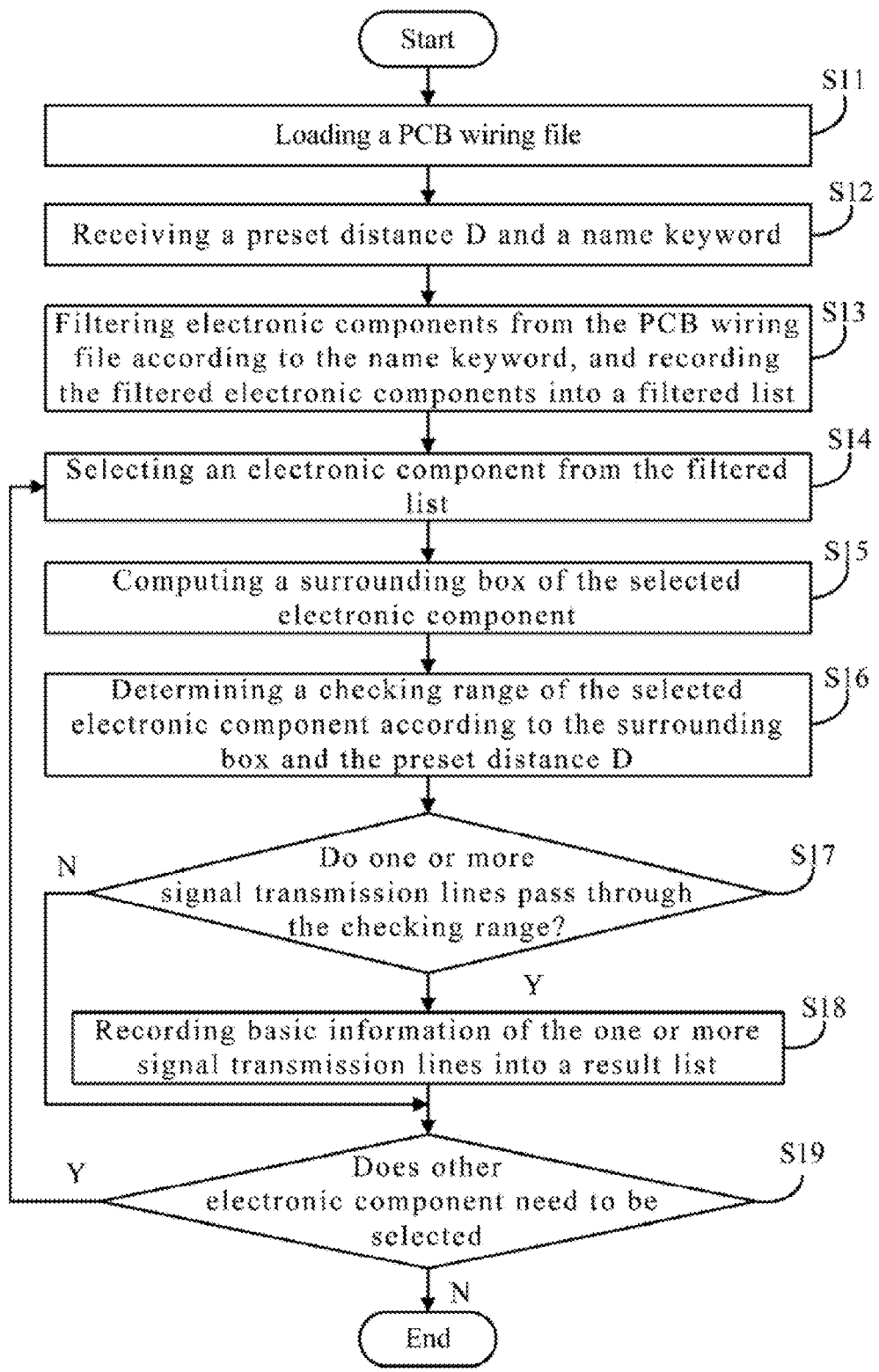
FIG. 4 illustrates a flowchart of one embodiment of a method for automatically checking wiring information.

FIG. 4 illustrates a flowchart of one embodiment of a method for automatically checking wiring information of a PCB. Depending on the embodiment, additional steps in FIG. 4 may be added, others removed, and the ordering of the steps may be changed.

In step S11, the loading module 100 loads a PCB wiring file 60 from the storage unit 30 of the computing device 1, and obtains the wiring diagram in the PCB wiring file 60.

In step S12, the receiving module 12 receives a preset distance D and one or more named keywords of electronic components of the wiring diagram in the PCB wiring file 60. In one embodiment, D=30 mils. In any other embodiment, D may be 0 or any other value. The named keyword may consist of U*, which means an initial character of the component name of an electronic component is U, such as U1, U2, U3, an so on. In one embodiment, the electronic components refer to high noise components.

In step S13, the filtering module 13 filters one or more electronic components from the PCB wiring file according to the named keyword, and records the filtered electronic components into a filtered list. For example, if the keyword name is U*, the filtered electronic components may by U1, U2, and U3, for example, and if the keyword name is *U, the filtered electronic components may be, 1U, 2U, and 3U, for example. The filtered list can be displayed on the display unit 40.

In step S14, the selection module 14 selects an electronic component from the filtered list.

Figure 5:
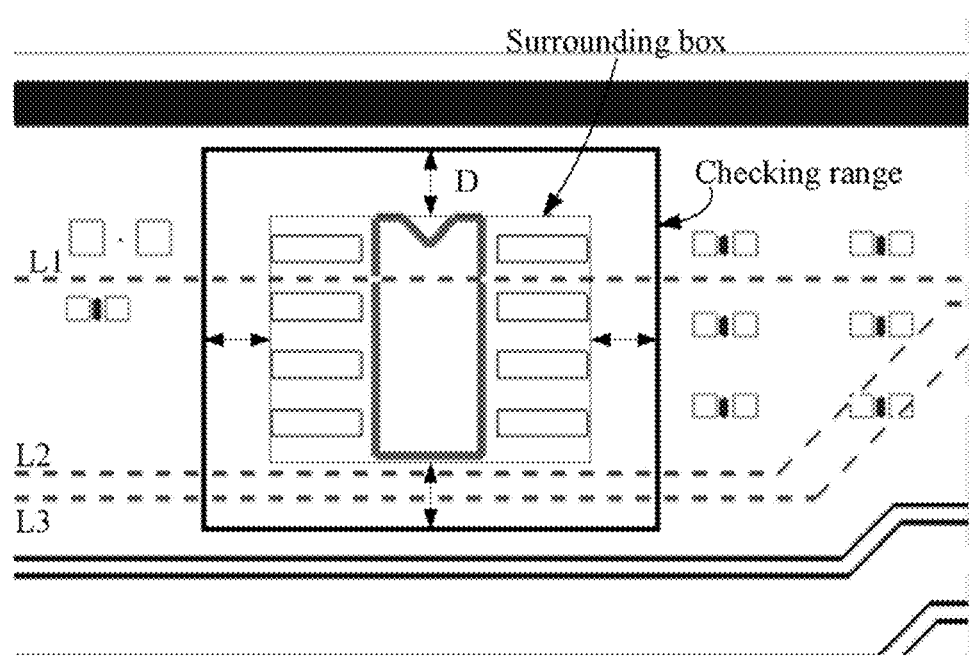
FIG. 5 illustrates a surrounding box and a checking range of an electronic component.

In step S15, the computation module 15 computes a surrounding box of the selected electronic component according to coordinates of the selected electronic component. The surrounding box is a minimal cube which can enclose the selected electronic component. In one embodiment, the computation module 15 acquires coordinates of edge points of the selected electronic component, and computes the surrounding box according to the coordinates of the edge points. One example of the surrounding box is illustrated in FIG. 5.

In step S16, the computation module 15 further computes a checking range of the selected electronic component according to the surrounding box and the preset distance D. As illustrated in FIG. 5, the checking range is computed by adding the preset distance D to each dimension of the surrounding box.

In step S17, the searching module 16 determines whether there are one or more signal transmission lines which pass within the checking range, by searching for such signal transmission lines within the checking range. Step S18 is implemented if at least one such signal transmission line exists, otherwise, step S19 is implemented if no such signal transmission line exists.

In step S18, the searching module 16 records basic information of the signal transmission lines that pass through the checking range into a result list. In one embodiment, the basic information may include line names of the signal transmission lines, PCB layers where the signal transmission lines embedded in, and coordinates of intersection points between the signal transmission lines and the checking range. The result list can be displayed on the display unit 40. From the result list, a user can know which signal transmission lines are near high noise components in the wiring diagram.

In step S19, the determination module 17 whether any other electronic components in the filtered list remains to be selected. The procedure returns to step S14 if any one of the electronic components in the filtered list remains to be selected. The flow ends if every electronic component in the filtered list has been selected.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computerized method for automatically checking wiring information, the method being executed by at least one processor of a computing device and comprising:
   selecting an electronic component from a filtered list which is generated according to a printed circuit board (PCB) wiring file;
   determining a checking range of the selected electronic component by receiving a preset distance D, computing a surrounding box of the selected electronic component according to coordinates of the selected electronic component, and computing the checking range of the selected electronic component according to the surrounding box and the preset distance D;
   searching for one or more signal transmission lines which pass within the checking range in the PCB wiring file;
   recording basic information of the one or more signal transmission lines into a result list; and
   displaying the result list on a display unit of the computing device.

2. The method according to claim 1, wherein the filtered list is generated by:
   receiving one or more named keywords of electronic components;
   filtering one or more electronic components from the PCB wiring file according to the named keyword; and
   recording the filtered electronic components into the filtered list.

3. The method according to claim 1, wherein the basic information comprises line names of the signal transmission lines, PCB layers where the signal transmission lines embed in, and coordinates of intersection points between the signal transmission lines and the checking range.

4. An electronic device, comprising:
   a display unit;
   a non-transitory storage medium;
   at least one processor; and
   one or more modules that are stored in the non-transitory storage medium; and are executed by the at least one processor, the one or more modules comprising instructions to:
   select an electronic component from a filtered list which is generated according to a printed circuit board (PCB) wiring file;
   determine a checking range of the selected electronic component by receiving a preset distance D, computing a surrounding box of the selected electronic component according to coordinates of the selected electronic component, and computing the checking range of the selected electronic component according to the surrounding box and the preset distance D;
   search for one or more signal transmission lines which pass within the checking range in the PCB wiring file;
   record basic information of the one or more signal transmission lines into a result list; and
   display the result list on the display unit.

5. The electronic device according to claim 4, wherein the one or more modules further comprising instructions to:
   receives one or more named keywords of electronic components;
   filter one or more electronic components from the PCB wiring file according to the named keyword; and
   record the filtered electronic components into the filtered list.

6. The electronic device according to claim 4, wherein the basic information comprises line names of the signal transmission lines, PCB layers where the signal transmission lines embed in, and coordinates of intersection points between the signal transmission lines and the checking range.

7. A non-transitory storage medium having stored thereon instructions that, when executed by a processor of a computing device, causes the processor to perform a method for automatically checking wiring information, comprising:
   selecting an electronic component from a filtered list which is generated according to a printed circuit board (PCB) wiring file;
   determining a checking range of the selected electronic component by receiving a preset distance D, computing a surrounding box of the selected electronic component according to coordinates of the selected electronic component, and computing the checking range of the selected electronic component according to the surrounding box and the preset distance D;
   searching for one or more signal transmission lines which pass within the checking range in the PCB wiring file;

recording basic information of the one or more signal transmission lines into a result list; and displaying the result list on a display unit of the computing device.

8. The non-transitory storage medium according to claim 7, wherein the filtered list is generated by:

receiving one or more named keywords of electronic components;

filtering one or more electronic components from the PCB wiring file according to the named keyword; and recording the filtered electronic components into the filtered list.

9. The non-transitory storage medium according to claim 7, wherein the basic information comprises line names of the signal transmission lines, PCB layers where the signal transmission lines embed in, and coordinates of intersection points between the signal transmission lines and the checking range.

* * * * *